United States Patent

Sharan

Patent Number: 5,977,636
Date of Patent: Nov. 2, 1999

[54] METHOD OF FORMING AN ELECTRICALLY CONDUCTIVE CONTACT PLUG, METHOD OF FORMING A REACTIVE OR DIFFUSION BARRIER LAYER OVER A SUBSTRATE, INTEGRATED CIRCUITRY, AND METHOD OF FORMING A LAYER OF TITANIUM BORIDE

[75] Inventor: Sujit Sharan, Boise, Id.

[73] Assignee: Micron Technology, Inc., Boise, Id.

[21] Appl. No.: 08/785,341

[22] Filed: Jan. 17, 1997

[51] Int. Cl.⁶ .......................... H01L 29/43; H01L 21/443
[52] U.S. Cl. .......................... 257/763; 257/741; 257/770; 438/675; 438/680; 438/655
[58] Field of Search ..................................... 438/680, 675, 438/685, 683, 655, 658; 257/763, 770, 915, 764, 751, 741

[56] References Cited

U.S. PATENT DOCUMENTS

| | | |
|---|---|---|
| 4,239,819 | 12/1980 | Holzl . |
| 4,296,309 | 10/1981 | Shinmi et al. ............................ 219/216 |
| 4,374,903 | 2/1983 | Intrater et al. ............................ 428/627 |
| 4,472,453 | 9/1984 | Hoffman ..................................... 427/35 |
| 5,057,163 | 10/1991 | Barnett et al. ............................ 136/258 |
| 5,132,145 | 7/1992 | Valentian .................................. 427/249 |
| 5,422,500 | 6/1995 | Tomikawa et al. ......................... 257/76 |
| 5,464,950 | 11/1995 | Horiuchi et al. .......................... 174/256 |
| 5,745,990 | 5/1998 | Lee et al. .................................. 29/852 |

FOREIGN PATENT DOCUMENTS 4-10572  1/1992  Japan .

OTHER PUBLICATIONS

C.S. Choi, et al. "Optimization and Characterization of LPCVD TiB$_2$ for ULSI Applications" J. Electrochem. Soc. V. 138 No. 10, pp. 3053–3061, Oct. 1991.

Primary Examiner—Caridad Everhart
Attorney, Agent, or Firm—Wells, St. John, Roberts, Gregory & Matkin P.S.

[57] ABSTRACT

Gaseous material is provided within a reactor having a substrate positioned therein, with the gaseous material comprising at least titanium and boron. The gaseous material is provided at conditions effective to chemical vapor deposit titanium boride on the substrate. In one implementation, the gaseous material is derived from at least two gases, with a first of such gases comprising titanium and a second of such gases comprising boron. Such can be utilized to form a reaction or diffusion barrier layer over a substrate relative to a contact opening. The invention also comprises integrated circuitry. In one implementation, a contact opening is formed into an insulating dielectric material over a substrate. An electrically conductive plugging material predominately comprising titanium boride substantially fills the contact opening. In another implementation, an electrically conductive electrode comprises a layer of titanium boride in contact with a layer of a refractory metal silicide. In still another implementation, integrated circuitry includes a contact electrode in ohmic electrical connection with a semiconductor substrate, where the contact electrode comprises a metal over the semiconductor substrate and a layer of titanium boride interposed between the metal and the semiconductor substrate.

45 Claims, 3 Drawing Sheets

METHOD OF FORMING AN ELECTRICALLY CONDUCTIVE CONTACT PLUG, METHOD OF FORMING A REACTIVE OR DIFFUSION BARRIER LAYER OVER A SUBSTRATE, INTEGRATED CIRCUITRY, AND METHOD OF FORMING A LAYER OF TITANIUM BORIDE

TECHNICAL FIELD

This invention relates generally to methods of forming electrically conductive contact plugs, to methods of forming a reactive or diffusion barrier layer over a substrate, to integrated circuitry, and to methods of forming titanium boride layers.

BACKGROUND OF THE INVENTION

Advanced semiconductor fabrication is employing increasing vertical circuit integration as designers continue to strive for circuit density maximization. Such typically includes multi-level metallization. Electrical interconnect techniques typically require electrical connection between metal layers or other conductive layers which are present at different elevations in the substrate. Such interconnecting is typically conducted, in part, by etching a contact opening through insulating material to the lower elevation metal layer or conductive region. Increased circuit density has resulted in narrower and deeper electrical contact openings between layers within the substrate. Adequate contact coverage within these deep and narrow contacts continues to challenge the designer in assuring adequate electrical connection between different elevation areas within the substrate.

As transistor active area dimensions approached one micron in diameter, conventional process parameters resulted in intolerable increased resistance between the active region or area and the conductive layer. The principal way of reducing such contact resistance is by formation of a metal silicide atop the active area prior to application of the conductive film for formation of the conductor runner. One common metal silicide material formed is $TiSi_x$, where x is predominantly "2". The $TiSi_x$ material is typically provided by first applying a thin layer of titanium atop the wafer which contacts the active areas within the contact openings. Thereafter, the wafer is subjected to a high temperature anneal. This causes the titanium to react with the silicon of the active area, thus forming the $TiSi_x$. Such a process is said to be self-aligning, as the $TiSi_x$ is only formed where the titanium metal contacts the silicon active regions. The applied titanium film everywhere else overlies an insulative, and substantially non-reactive, doped or undoped $SiO_2$ layer.

Ultimately, an electrically conductive contact filling material such as tungsten or aluminum would be provided for making electrical connection to the contact. However, tungsten adheres poorly to $TiSi_x$. Additionally, it is desirable to prevent intermixing of the contact filling material with the silicide and underlying silicon. Accordingly, an intervening layer is typically provided to prevent the diffusion of the silicon and silicide with the plug filling metal, and to effectively adhere the plug filling metal to the underlying substrate. Such material is, accordingly, also electrically conductive and commonly referred to as a "barrier layer" due to the anti-diffusion properties.

SUMMARY

In but one aspect, the invention provides a method of forming a layer of titanium boride over a substrate. The preferred implementation is by chemical vapor deposition. Gaseous material is provided within a reactor having a substrate positioned therein, with the gaseous material comprising at least titanium and boron. The gaseous material is provided at conditions effective to chemical vapor deposit titanium boride on the substrate. In one implementation, the gaseous material is derived from at least two gases, with a first of such gases comprising titanium and a second of such gases comprising boron. Such can be utilized to form a reaction or diffusion barrier layer over a substrate relative to a contact opening.

In other aspects, the invention comprises integrated circuitry. In one specific implementation, a contact opening is formed into an insulating dielectric material over a substrate. An electrically conductive plugging material predominately comprising titanium boride substantially fills the contact opening. In another implementation, an electrically conductive electrode comprises a layer of titanium boride in contact with a layer of a refractory metal silicide. In still another implementation, integrated circuitry includes a contact electrode in ohmic electrical connection with a semiconductor substrate, where the contact electrode comprises a metal over the semiconductor substrate and a layer of titanium boride interposed between the metal and the semiconductor substrate.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
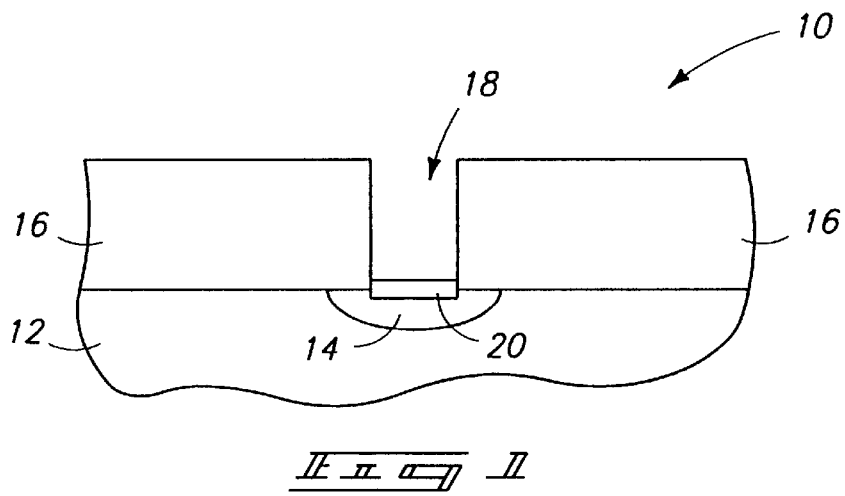
FIG. 1 is a diagrammatic sectional view of a semiconductor wafer fragment at one processing step in accordance with the invention.

This disclosure of the invention is submitted in furtherance of the constitutional purposes of the U.S. Patent Laws "to promote the progress of science and useful arts" (Article 1, Section 8).

In the context of this document, the term "semiconductor substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Preferred methods of fabricating integrated circuitry in accordance with the invention are initially described with reference to FIGS. 1–4, where a substrate in process is indicated generally with reference numeral 10. Such comprises a semiconductor substrate 12, preferably bulk monocrystalline silicon, having an electrically conductive diffusion region 14 formed therein. An insulating dielectric layer 16, such as borophosphosilicate glass (BPSG), is provided outwardly of semiconductor substrate 12. A contact opening 18 is formed into insulating dielectric layer 16 over substrate diffusion region 14. Contact opening 18 is ideally initially formed completely through insulating dielectric layer 16 to outwardly exposed conductive diffusion region 14. Subsequently, a refractory metal silicide layer 20 is formed within contact opening 18 in ohmic electrical connection with diffusion region 14 of semiconductor substrate 12.

The preferred manner by which refractory metal silicide layer 20 is provided is initial deposition of a refractory metal over the substrate, followed by high temperature anneal. Portions of the refractory metal which do not overlie silicon and therefor do not form a silicide are stripped from the wafer leaving the illustrated refractory metal silicide layer 20 in contact with diffusion region 14. An example and preferred refractory metal silicide for region 20 is titanium silicide.

Figure 2:
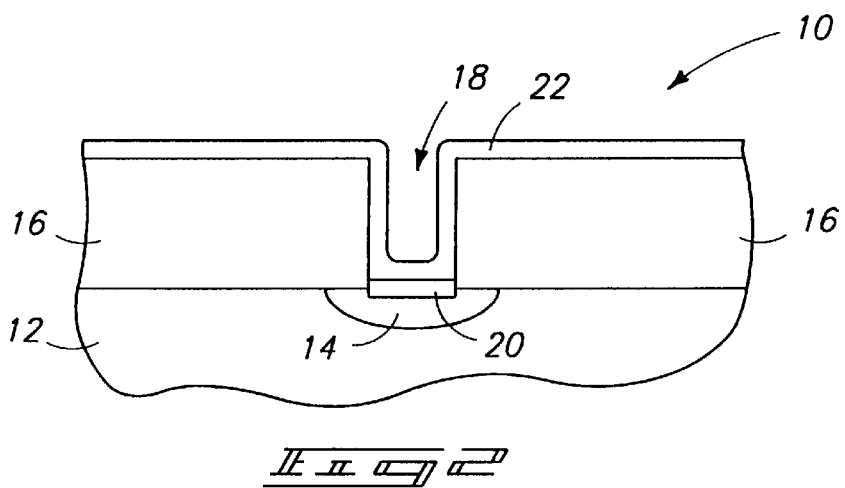
FIG. 2 is a view of the FIG. 1 wafer at a processing step subsequent to that shown by FIG. 1.

Referring to FIG. 2, substrate 10 is positioned within a chemical vapor deposition reactor. Gaseous material comprising at least titanium and boron is provided within the reactor under conditions effective to chemical vapor deposit a titanium boride layer 22 over the substrate and within contact opening 18 on silicide layer 20 and over diffusion region 14. In the context of this document, titanium boride is intended to refer to TiB$_x$, where "x" will typically predominately be "2" so the deposited material is a titanium boride of the diboride form. Layer 22 is deposited to a thickness which less than completely fills contact opening 18.

Preferably, the gaseous material is derived from providing at least two gases within the reactor, where a first of such gases comprises titanium and a second of such gases comprises boron. Exemplary and preferred titanium containing gases are titanium tetrahalides, for example of the formula TiX$_4$ where "X" is one of Cl, Br or I, and/or mixtures of such gases. An example and preferred boron containing gas is B$_2$H$_6$. One example alternate is BCl$_3$. Also preferably, gaseous H$_2$ is provided within the reactor, with the reaction conditions including a pressure of less than about 100 Torr and a temperature of at least about 400° C. to effect the illustrated blanket chemical vapor deposition. Preferred respective volumetric ratios of titanium tetrahalide to B$_2$H$_6$ to H$_2$ within the reactor is preferably 1:2.0–2.5:10–20.

An exemplary equation for such reaction is as follows:

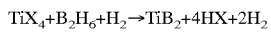

$$TiX_4 + B_2H_6 + H_2 \rightarrow TiB_2 + 4HX + 2H_2$$

H$_2$ is a highly desired reaction component for facilitating moving the reaction to the desired TiB$_2$ product.

The chemical vapor deposition can be conducted using hot or cold wall thermal chemical vapor deposition. Under such conditions, the preferred temperature within the reactor (hot wall) or of the susceptor (cold wall) is from about 600° C. to about 750° C., with pressure conditions within the reactor being from about 1 Torr to about 100 Torr.

Further, the chemical vapor deposition can be plasma enhanced in either a cold wall or hot wall PECVD reactor. When plasma is utilized, the gaseous material also preferably includes an inert gas, such as Ar, to facilitate maintaining gaseous material in the reactor in the plasma state during deposition. Preferred conditions in a PECVD reactor are to maintain the susceptor at a temperature of from about 400° C. to about 600° C., with pressure being maintained at from about 1 Torr to about 10 Torr. RF power is preferably provided at from about 400 watts to about 1000 watts. Where Ar or another inert gas is utilized, it is preferably provided at a volumetric flow rate at from 5 to 10 times the titanium tetrahalide flow rate.

Figure 3:
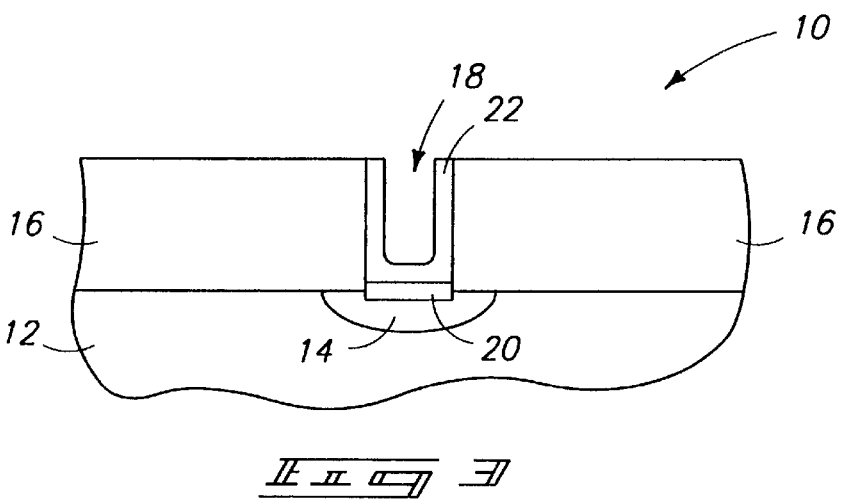
FIG. 3 is a view of the FIG. 1 wafer at a processing step subsequent to that shown by FIG. 2.

Referring to FIG. 3, titanium boride is removed from outwardly of contact opening 18 as shown. Such can be conducted my mechanical or other planarizing action.

Figure 4:
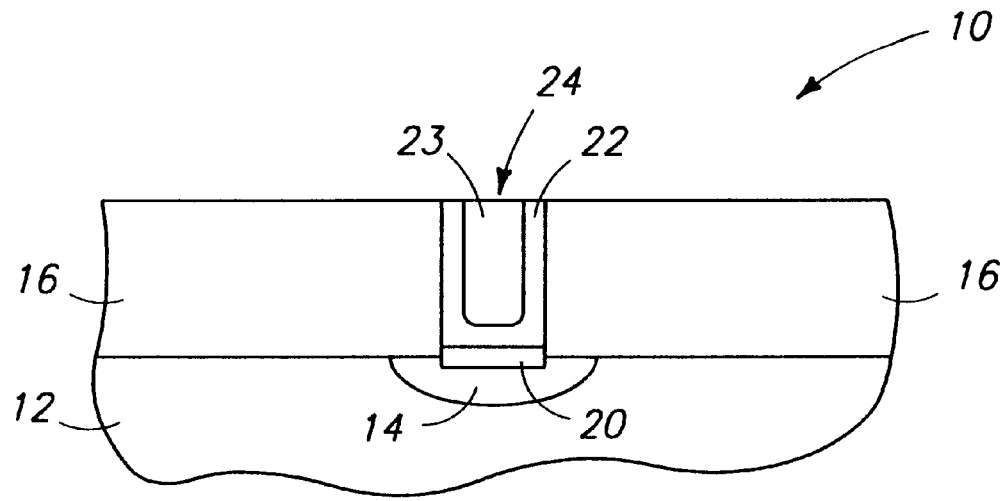
FIG. 4 is a view of the FIG. 1 wafer at a processing step subsequent to that shown by FIG. 3.

Referring to FIG. 4, remaining portions of contact opening 18 are plugged with metal material 23, such as tungsten, to fill the contact opening to form a contact plug or electrode 24 to diffusion region 14, with such effectively comprising a sandwich of a refractory metal silicide, titanium boride, and metal. Thus in the illustrated and preferred embodiment, contact electrode 24 comprises a metal 23 provided over a semiconductor substrate and a layer of titanium boride interposed between the metal and semiconductor substrate. Further ideally, a refractory metal silicide is interposed between the titanium boride and semiconductor substrate.

Figure 5:
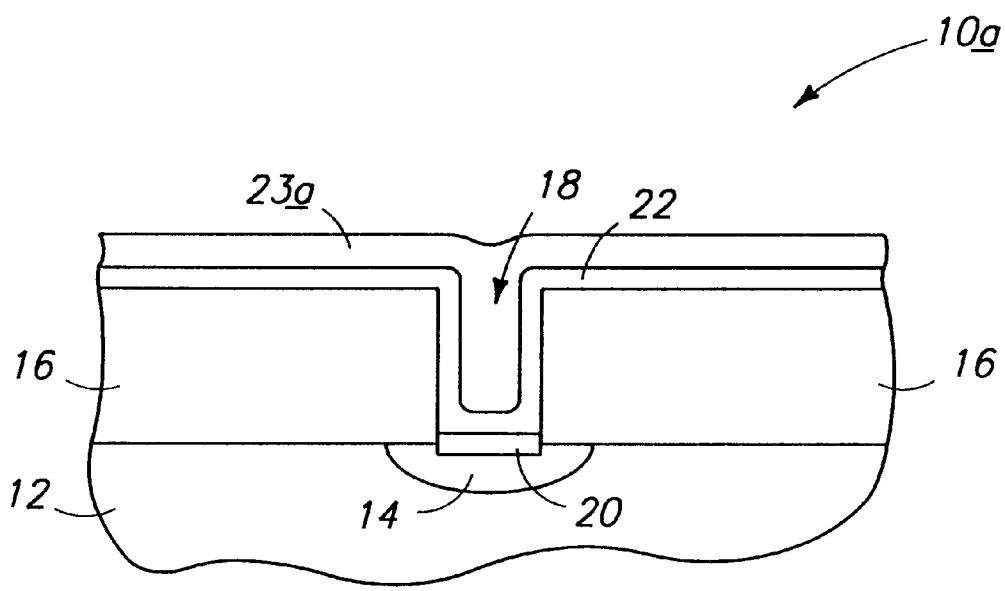
FIG. 5 is an alternate processing embodiment view to that depicted by FIG. 3.

In the above described embodiment, the titanium boride is shown as being removed outwardly of the contact opening prior to plugging remaining portions of the contact opening with conductive material. FIG. 5 illustrates an alternate embodiment wafer fragment 10a wherein such removing occurs after plugging. Like numerals from the first described embodiment are utilized where appropriate, with differences being indicated with the suffix "a" or with different numerals. Here, a tungsten layer 23a is provided prior to removing material of layer 22 from outwardly of insulating dielectric layer 16. The construction of FIG. 5 would then be planarized, such as by chemical mechanical polishing or resist etch back, to produce the illustrated FIG. 4 construction.

Figure 6:
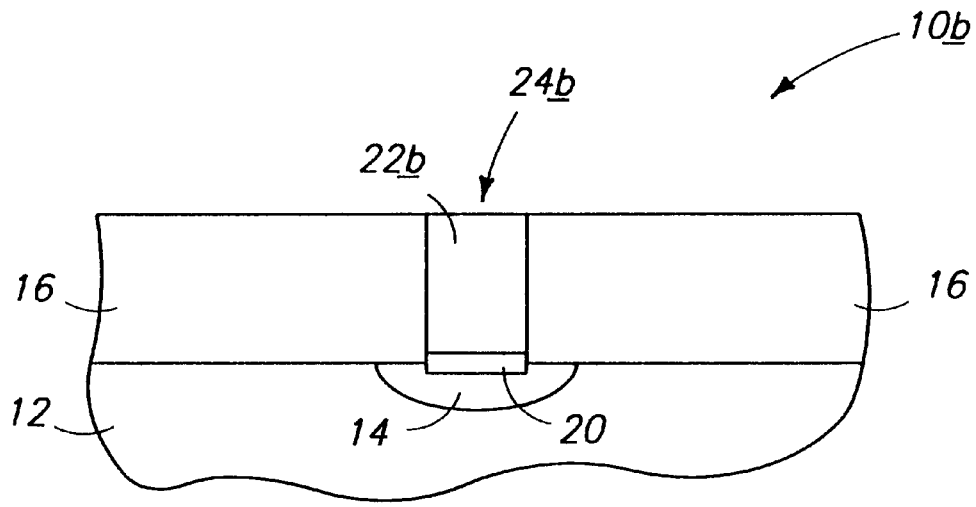
FIG. 6 is a diagrammatic sectional view of an alternate embodiment semiconductor wafer fragment at one processing step in accordance with the invention.

A further alternate embodiment in accordance with the invention is depicted with numeral 10b in FIG. 6. Like numerals from the first described embodiment are utilized where appropriate, with differences being indicated with the suffix "b" or with different numerals. In this depicted embodiment, the titanium boride material 22b has been deposited to a thickness effective to essentially completely fill the remaining portion of the contact opening 18, and then subjected to a planarizing step. Such results in the electrically conductive plug or electrode 24b predominantly comprising titanium boride.

Figure 7:
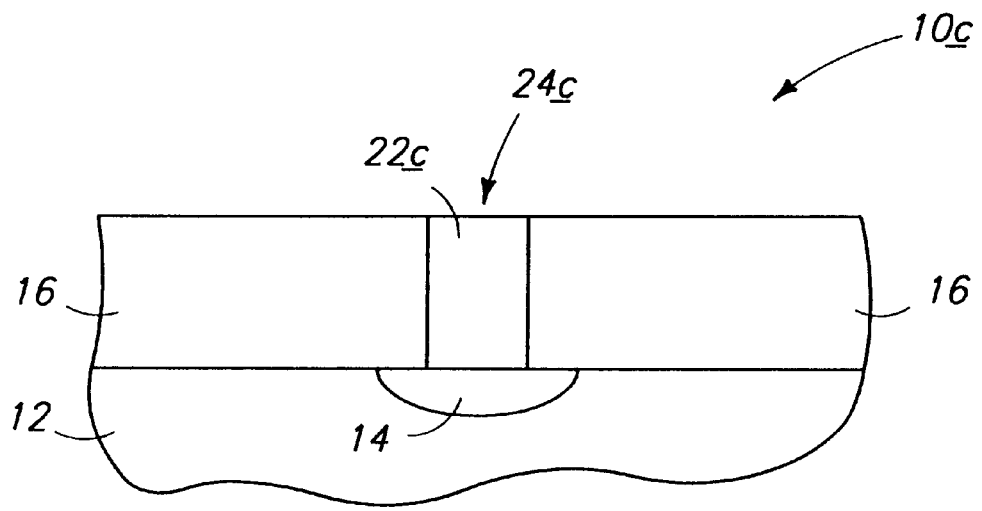
FIG. 7 is a diagrammatic sectional view of another alternate embodiment semiconductor wafer fragment at one processing step in accordance with the invention.

A further alternate embodiment in accordance with the invention is shown and described with reference to FIG. 7. Like numerals from the first described embodiment are utilized where appropriate, with differences being indicated with the suffix "c" or with different numerals. Here, provision of the silicide has been eliminated such that all of the plugging material 22c within contact opening 18 constitutes titanium boride which is in contact with the semiconductor substrate.

The prior art is understood to have utilized titanium boride in the formation of conductive lines. However, such material has never been understood to have been suggested for use as barrier layer materials in the manner described and claimed, nor provided by chemical vapor deposition over any substrate. The resultant produced titanium boride will have little if any carbon incorporation, as would otherwise occur in titanium nitride barrier layers deposited by chemical vapor deposition utilizing metal organic precursors.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A method of forming a layer of titanium boride over a substrate comprising the following steps;

positioning a substrate within a chemical vapor deposition reactor; and providing gaseous material comprising at least titanium and boron within the reactor under conditions effective to chemical vapor deposit titanium boride on the substrate, the substrate comprising an outer surface of a refractory metal silicide, the titanium boride being deposited on the refractory metal silicide.

2. A method of forming a layer of titanium boride over a substrate comprising the following steps;

positioning a substrate within a chemical vapor deposition reactor;

providing at least two gases within the reactor, a first of the gases comprising titanium, a second of the gases comprising boron; and providing the two gases within the reactor under conditions effective to impart a chemical reaction of the first gas with the second gas to chemical vapor deposit titanium boride on the substrate, the substrate comprising an outer surface of a refractory metal silicide, the titanium boride being deposited on the refractory metal silicide.

3. A method of forming a reaction or diffusion barrier layer over a substrate relative to a contact opening comprising the following steps;

providing a substrate within a chemical vapor deposition reactor, the substrate comprising a semiconductor substrate having a conductively doped diffusion region formed therein, an insulating dielectric layer being formed over the diffusion region and a contact opening formed into the insulating dielectric layer over the substrate diffusion region;

providing gaseous material comprising at least titanium and boron within the reactor under conditions effective to chemical vapor deposit a reaction or diffusion barrier layer of titanium boride within the contact opening over the diffusion region; and forming at least one metal layer over the titanium boride barrier layer to substantially fill the contact opening.

4. The method of forming a layer of titanium boride of claim 3 wherein the gaseous material includes $H_2$.

5. The method of forming a layer of titanium boride of claim 3 further comprising a refractory metal silicide received on the diffusion region, and the titanium boride is deposited on the refractory metal silicide.

6. A method of forming an electrically conductive contact plug comprising the following steps:

providing a substrate within a chemical vapor deposition reactor, the substrate comprising monocrystalline silicon having a conductively doped diffusion region formed therein, an insulating dielectric layer being formed over the diffusion region and a contact opening formed through the insulating dielectric layer to the substrate diffusion region, a refractory metal silicide layer being in contact with the diffusion region within the contact opening;

providing a gaseous titanium tetrahalide, gaseous $B_2H_6$ and gaseous $H_2$ within the reactor at a pressure of less than about 100 Torr and at a temperature of at least about 400° C. under conditions effective to blanket chemical vapor deposit a layer of titanium boride over the substrate and within the contact opening in contact with the refractory metal silicide, the layer of titanium boride being chemical vapor deposited to a thickness which less than completely fills the contact opening, the respective volumetric ratios of titanium tetrahalide to $B_2H_6$ to $H_2$ within the reactor being 1:2.0–2.5:10–20;

removing titanium boride from outwardly of the contact opening; and plugging remaining portions of the contact opening with metal to fill the contact opening to form a contact plug to the diffusion region comprising a sandwich of refractory metal silicide/titanium boride/metal.

7. The method of forming a layer of titanium boride of claim 6 wherein the removing occurs before the plugging.

8. The method of forming a layer of titanium boride of claim 6 wherein the removing occurs after the plugging.

9. The method of forming a layer of titanium boride of claim 6 wherein the refractory metal silicide is titanium silicide.

10. An integrated circuit comprising:

a semiconductor substrate;

an insulating dielectric material formed over the substrate;

a contact opening formed into the insulating dielectric material over the substrate; and an electrically conductive plugging material substantially filling the contact opening, the plugging material predominately comprising titanium boride.

11. The integrated circuit of claim 10 wherein the contact opening is formed completely through the insulating dielectric layer to the semiconductor substrate, all the conductive plugging material within the contact opening constituting titanium boride in contact with the semiconductor substrate.

12. The integrated circuit of claim 10 wherein the contact opening is formed completely through the insulating dielectric layer to the semiconductor substrate, a layer of a refractory metal silicide being in contact with the semiconductor substrate, the titanium boride being received over and in contact with the refractory metal silicide.

13. The integrated circuit of claim 10 wherein the semiconductor substrate comprises bulk monocrystalline silicon having an electrically conductive diffusion region formed therein, the contact opening being formed completely through the insulating dielectric layer to the diffusion region of the semiconductor substrate, a layer of titanium silicide being in contact with the semiconductor substrate, the titanium boride being received over and in contact with the titanium silicide.

14. An integrated circuit comprising:

a bulk monocrystalline silicon semiconductor substrate;

a conductively doped diffusion region formed within the silicon substrate;

an insulating dielectric layer formed over the silicon substrate;

a contact opening formed within the insulating dielectric layer to the diffusion region; and the contact opening being plugged with an electrically conductive material in ohmic electrical connection with the diffusion region; the electrically conductive plugging material within the contact opening comprising titanium silicide in contact with the silicon substrate diffusion region, titanium boride overlying and contacting the titanium silicide, and tungsten overlying and contacting the titanium boride.

15. The method of claim 1 wherein the substrate comprises a semiconductor substrate.

16. The method of claim 1 wherein the substrate comprises a semiconductor substrate, and the refractory metal silicide is in contact with the semiconductor substrate.

17. The method of claim 1 wherein the substrate comprises a monocrystalline silicon semiconductor substrate.

18. The method of claim 1 wherein the substrate comprises a monocrystalline silicon semiconductor substrate, and the refractory metal silicide is in contact with the monocrystalline silicon.

19. A method of forming a layer of titanium boride over a substrate comprising the following steps;

positioning a substrate within a chemical vapor deposition reactor; and providing gaseous material comprising at least titanium and boron within the reactor under conditions effective to chemical vapor deposit titanium boride on the substrate, the substrate comprising an outer surface of a refractory metal silicide, the titanium boride being deposited over the refractory metal silicide.

20. The method of claim 19 wherein the substrate comprises a semiconductor substrate.

21. The method of claim 19 wherein the substrate comprises a semiconductor substrate, and the refractory metal silicide is in contact with the semiconductor substrate.

22. The method of claim 19 wherein the substrate comprises a monocrystalline silicon semiconductor substrate.

23. The method of claim 19 wherein the substrate comprises a monocrystalline silicon semiconductor substrate, and the refractory metal silicide is in contact with the monocrystalline silicon.

24. The method of claim 2 wherein the substrate comprises a semiconductor substrate.

25. The method of claim 2 wherein the substrate comprises a semiconductor substrate, and the refractory metal silicide is in contact with the semiconductor substrate.

26. The method of claim 2 wherein the substrate comprises a monocrystalline silicon semiconductor substrate.

27. The method of claim 2 wherein the substrate comprises a monocrystalline silicon semiconductor substrate, and the refractory metal silicide is in contact with the monocrystalline silicon.

28. A method of forming a layer of titanium boride over a substrate comprising the following steps;

positioning a substrate within a chemical vapor deposition reactor;

providing at least two gases within the reactor, a first of the gases comprising titanium, a second of the gases comprising boron; and providing the two gases within the reactor under conditions effective to impart a chemical reaction of the first gas with the second gas to chemical vapor deposit titanium boride on the substrate, the substrate comprising an outer surface of a refractory metal silicide, the titanium boride being deposited over the refractory metal silicide.

29. The method of claim 28 wherein the substrate comprises a semiconductor substrate.

30. The method of claim 28 wherein the substrate comprises a semiconductor substrate, and the refractory metal silicide is in contact with the semiconductor substrate.

31. The method of claim 28 wherein the substrate comprises a monocrystalline silicon semiconductor substrate.

32. The method of claim 28 wherein the substrate comprises a monocrystalline silicon semiconductor substrate, and the refractory metal silicide is in contact with the monocrystalline silicon.

33. The method of claim 3 wherein the titanium boride is deposited within the contact opening on the diffusion region.

34. The method of claim 3 further comprising planarizing the titanium boride away from outwardly of the insulating dielectric layer prior to forming the at least one metal layer.

35. The method of claim 3 further comprising planarizing the titanium boride and the at least one metal layer away from outwardly of the insulating dielectric layer after forming the at least one metal layer.

36. A method of forming a reaction or diffusion barrier layer over a substrate relative to a contact opening comprising the following steps;

providing a substrate within a chemical vapor deposition reactor, the substrate comprising conductively doped semiconductive material, an insulating dielectric layer being formed over the conductively doped semiconductive material and a contact opening formed into the insulating dielectric layer over the conductively doped semiconductive material;

providing gaseous material comprising at least titanium and boron within the reactor under conditions effective to chemical vapor deposit a reaction or diffusion barrier layer of titanium boride within the contact opening over the conductively doped semiconductive material; and forming at least one metal layer over the titanium boride barrier layer to substantially fill the contact opening.

37. The method of claim 36 wherein the titanium boride is deposited within the contact opening on the diffusion region.

38. The method of forming a layer of titanium boride of claim 36 further comprising a refractory metal silicide received on the conductively doped semiconductive material, and the titanium boride is deposited on the refractory metal silicide.

39. The method of claim 36 further comprising planarizing the titanium boride away from outwardly of the insulating dielectric layer prior to forming the at least one metal layer.

40. The method of claim 36 further comprising planarizing the titanium boride and the at least one metal layer away from outwardly of the insulating dielectric layer after forming the at least one metal layer.

41. The integrated circuit of claim 10 wherein the electrically conductive plugging material comprises at least two discrete materials one of which is titanium boride.

42. An integrated circuit comprising:

a substrate;

an insulating dielectric material formed over the substrate;

a contact opening formed into the insulating dielectric material over the substrate; and an electrically conductive plugging material substantially filling the contact opening, the plugging material predominately comprising titanium boride.

43. The integrated circuit of claim 42 wherein the contact opening is formed completely through the insulating dielectric layer to the semiconductor substrate, all the conductive plugging material within the contact opening constituting titanium boride in contact with the semiconductor substrate.

44. The integrated circuit of claim 42 wherein the contact opening is formed completely through the insulating dielectric layer to the semiconductor substrate, a layer of a refractory metal silicide being in contact with the semiconductor substrate, the titanium boride being received over and in contact with the refractory metal silicide.

45. The integrated circuit of claim 42 wherein the electrically conductive plugging material comprises at least two discrete materials one of which is titanium boride.

* * * * *

UNITED STATES PATENT AND TRADEMARK OFFICE
CERTIFICATE OF CORRECTION

PATENT NO.    : 5,977,636

DATED         : November 2, 1999

INVENTOR(S)   : Sujit Sharan

It is certified that error appears in the above-identified patent and that said Letters Patent is hereby corrected as shown below:

Col. 4, line 11, replace "my" with --by--.

Signed and Sealed this

Fourth Day of July, 2000

Attest:

Q. TODD DICKINSON

*Attesting Officer*       *Director of Patents and Trademarks*